Nov. 20, 1962

L. M. VALLESE 3,065,360

TRANSISTOR THYRATRON CIRCUIT EMPLOYING GROUNDED-EMITTER SILICON CONTROLLED RECTIFIER OR EQUIVALENT

Filed May 19, 1959

2 Sheets-Sheet 1

INVENTOR.
LUCIO M. VALLESE
BY
Louis B. Applebaum
ATTORNEY

Nov. 20, 1962

L. M. VALLESE

TRANSISTOR THYRATRON CIRCUIT EMPLOYING GROUNDED-EMITTER SILICON CONTROLLED RECTIFIER OR EQUIVALENT 3,065,360

Filed May 19, 1959

2 Sheets-Sheet 2

INVENTOR.
LUCIO M. VALLESE
BY
Louis B. Applebaum
ATTORNEY

United States Patent Office 3,065,360
Patented Nov. 20, 1962

3,065,360

TRANSISTOR THYRATRON CIRCUIT EMPLOYING GROUNDED-EMITTER SILICON CONTROLLED RECTIFIER OR EQUIVALENT

Lucio M. Vallese, New York, N.Y., assignor, by mesne assignments, to the United States of America as represented by the Secretary of the Navy Filed May 19, 1959, Ser. No. 814,359
12 Claims. (Cl. 307—88.5)

This application is a continuation-in-part of my copending application, Serial No. 754,953, filed August 14, 1958, for "Transistor Amplifier," now abandoned.

This invention relates to transistor circuits and especially to a transistor circuit having the characteristics of a thyratron.

The desirability of a transistor circuit having the characteristics of a thyratron over the ordinary gaseous thyratron lies in the greatly accelerated rise and decay times of the transistor circuit over those available with gaseous thyratrons. Rise and decay times of approximately 8 and 20 microseconds respectively characterize the transistor circuits shown herein, whereas the deionization time of ordinary thyratrons ranges from about 400 to 1000 microseconds.

The objects and advantages of the present invention are accomplished by utilizing a transistor to provide positive feedback to a second transistor which is arranged in a common emitter circuit scheme, the collector of the second being connected to the base of the first and the collector of the first being connected to the base of the second. Triggering signals may be applied to the base of the second transistor (base triggering) or to the emitter of the first and the collector of the second (collector triggering).

A useful application of the transistor thyratron circuit is to combine it with a capacitor and a capacitor charging circuit to form a sawtooth generator.

An object of the present invention is to provide a transistor circuit having thyratron switching characteristics.

Another object is to provide a transistor circuit having thyratron switching characteristics but considerably faster switching speeds.

A further object is to provide a speedy thyratron-like switching circuit for a capacitative sawtooth wave generator.

Other objects and many of the attendant advantages of this invention will be readily appreciated as the same becomes better understood by reference to the following detailed description when considered in connection with the accompanying drawings wherein.

Similar reference characters apply to similar elements in the different views.

Figure 1:
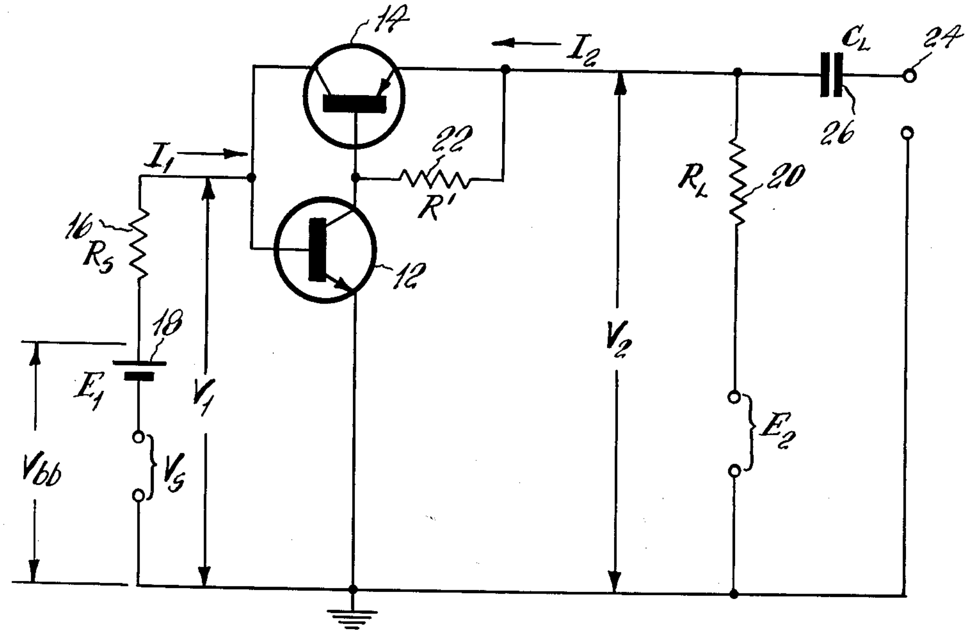
FIG. 1 is a schematic circuit diagram of an embodiment of the invention.

In FIG. 1, a pair of transistors 12 and 14 are connected in a circuit configuration which shall be designated herein as a "hook common emitter" circuit. The emitter of transistor 12 is grounded and the resultant input signal ($V_1$) is applied to its base. The collector of transistor 12 is connected to the base of transistor 14 and the collector of transistor 14 is coupled back to the base of transistor 14. The latter transistor thus provides positive feedback for transistor 12.

Forward bias for the base-emitter circuit of transistor 12 is provided through a resistance 16 ($R_s$) by a source of constant potential 18 ($E_1$) which can be a battery. Terminals for an input signal ($V_s$) are arranged in series with the battery 18 and input resistance 16.

A source of constant supply voltage ($E_2$) is connected to the emitter of transistor 14 through a load impedance 20 which, in this case, is a resistance ($R_L$). A further resistance 22 ($R'$), connected from the emitter of transistor 14 to the collector of transistor 12, applies supply voltage to the latter.

A terminal 24 is connected to the low-potential end of the load resistance 20 through a blocking capacitor 26 ($C_L$). This terminal 24 may be employed as an output terminal or an input terminal for collector triggering, as required for particular applications.

The transistor types shown in FIG. 1 may be interchanged with their complementary types provided that the polarities of the supply voltages are reversed.

Figure 2:
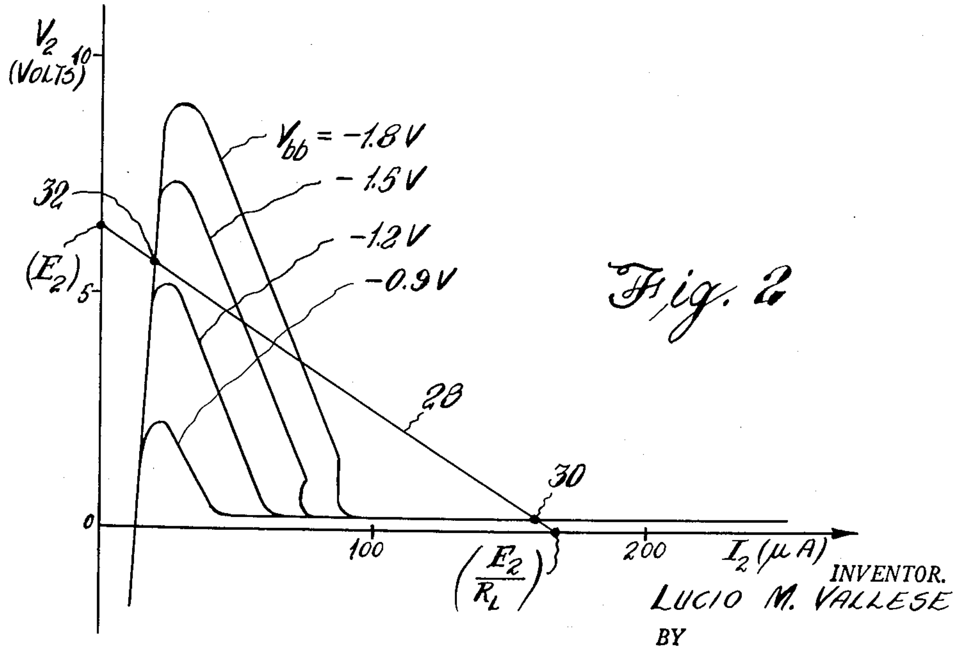
FIG. 2 is a graph of the output current and voltage of the embodiment of FIG. 1 for various values of input biasing voltage.

FIG. 2 is a family of characteristic curves for this circuit illustrating the variation of the output voltage ($V_2$), which is the voltage from the low-potential end of the load resistance 20 to ground, with the load current ($I_2$) for various values of $V_{bb}$. $V_{bb}$ is the sum of $E_1$ and $V_s$.

It can be seen that each of the curves is divided into three regions: firstly, a linear region in which $V_2$ increases directly with $I_2$; secondly, a negative resistance region in which $V_2$ decreases while $I_2$ is increasing; and thirdly, a breakdown region in which $V_2$ remains practically constant at a fixed low value while $I_2$ increases enormously.

Also shown in FIG. 2 is a load line 28 for a value of load resistance 20 which passes through the three regions of the characteristic.

One mode of operation of the transistor thyratron circuit is collector triggering, i.e., the application of voltage pulses at terminal 24. Assuming that the initial point of bias is at (32), if a positive pulse of sufficient magnitude to bring the circuit into the negative resistance region is applied at terminal 24, the load current ($I_2$) increases until point 30 is reached. The circuit will continue to operate at this point until a negative pulse of sufficient magnitude to drive the circuit into its cutoff region is applied. The circuit will then operate at point 32.

By proper pulsing, the circuit can be made to switch between two steady states, one of high output current and low output voltage (output voltage from terminal 24 to ground) and another of low output current and high output voltage.

The same result can be achieved by base triggering, i.e., varying the resultant input voltage ($V_1$) by means of input pulses ($V_s$). The difference between collector and base triggering consists in the fact that, in collector triggering, the trigger pulse produces a displacement of the load line, the slope of which remains constant; triggering occurs when the load line "clears" either end of the negative resistance region of the output characteristic ($V_2$, $I_2$ curves). In base triggering, the trigger pulse produces a modification or displacement of the output characteristic ($V_2$, $I_2$ curves) since the output characteristic depends upon the value of the voltage ($V_{bb}$); triggering occurs when the displacement of the characteristic is such that the load line again "clears" either end of the negative resistance region of the output characteristic.

Figure 3:
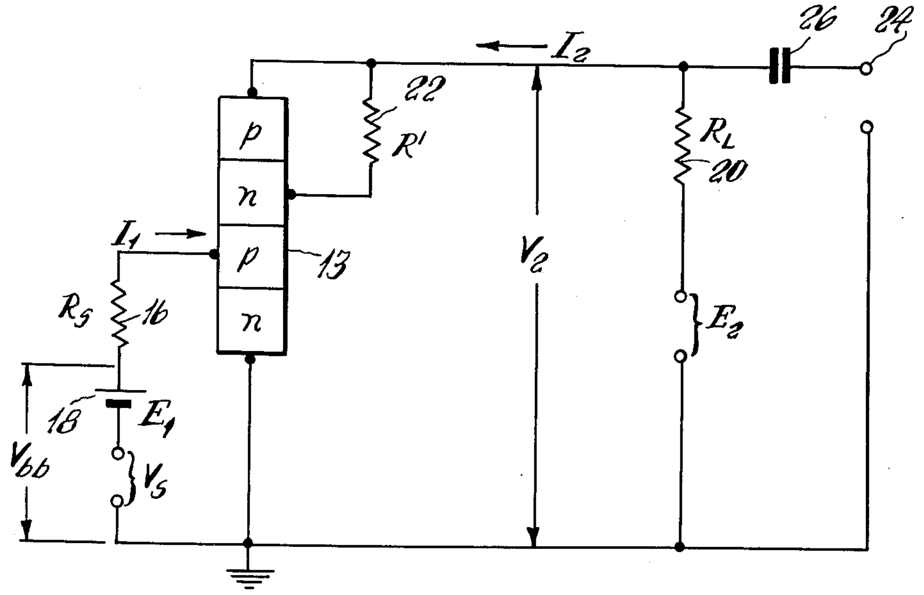
FIG. 3 is a schematic circuit diagram of an embodiment of the invention in which a multi-layer transistor is substituted for the two transistors of FIG. 1.

FIG. 3 illustrates an embodiment of the invention which is similar to that of FIG. 1, except that a four-layer transistor 13 of alternating n- and p-material layers is substituted for the two transistors 12 and 14 in a hook circuit arrangement (i.e., the base of one transistor is connected to the collector of the other, and vice versa). The n-p-n-p (or p-n-p-n) multilayer transistor is equivalent to a hook circuit arrangement of an n-p-n and p-n-p transistor (or p-n-p and n-p-n transistor), so that the rest of the circuit remains the same schematically.

Figure 4:
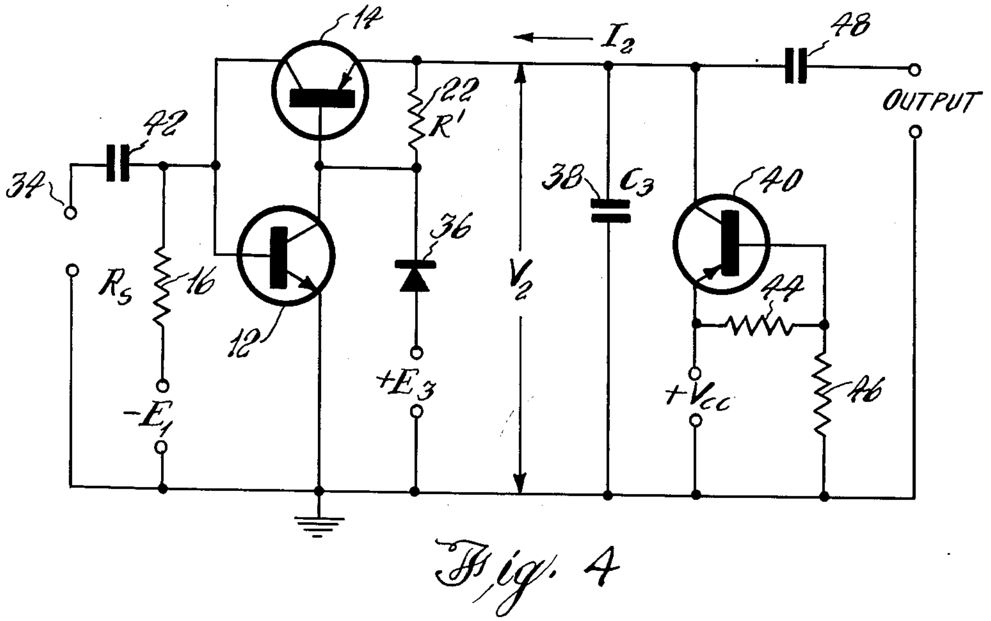
FIG. 4 is a schematic circuit diagram of a sawtooth generator utilizing the thyratron transistor circuit as a switch for the capacitor.

One application of the transistor thyratron is in the sawtooth generator shown in FIG. 4. Here capacitor 38 ($C_3$) is charged through transistor 40 toward the value of supply voltage ($+V_{cc}$). When a positive input pulse of sufficient magnitude is applied at input terminal 34, the transistor thyratron circuit comprising transistors 12 and 14 becomes a very low resistance (high $I_2$; low $V_2$) and quickly discharges capacitor 38 ($C_3$). A second pulse of negative polarity at input terminal 34 causes the transistor thyratron circuit to assume its original high resistance state, thereby permitting the capacitor 38 to recharge.

Diode 36 is employed to prevent the voltage on the collector of transistor 12 from falling below a value, $E_3$, below which saturation effects occur.

Typical component values for the embodiment of the invention shown in FIG. 4 are:

| | | |
|---|---|---|
| Transistor **12** | | 2N165 |
| Transistor **14** | | 2N43 |
| Transistor **40** | | 2N43 |
| Diode **36** | | S10G |
| Resistance **16** | ohms | 5,000 |
| Resistance **22** | do | 500 |
| Resistance **44** | do | 50,000 |
| Resistance **46** | do | 1,300 |
| Capacitor **38** | μfd | 0.01 |
| Capacitor **42** | do | 0.01 |
| Capacitor **48** | do | 0.01 |
| Voltage $+V_{cc}$ | volts | 24 |
| Voltage $+E_3$ | do | 6 |
| Voltage $-E_1$ | do | 3 |

Obviously many modifications and variations of the present invention are possible in the light of the above teachings. It is therefore to be understood that within the scope of the appended claims the invention may be practiced otherwise than as specifically described.

I claim:

1. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a pair of connections for a source of biasing potential for said other transistor and a pair of connections for an input signal, said two pairs of connections being connected between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load impedance and a pair of connections for a source of supply potential connected between the emitter element of said feedback transistor and said point of reference potential, the latter being connected to one of said supply-source connections, said output circuit also including a pair of output connections, one being connected to said point of reference potential and the other, which forms the third terminal of said transistor circuit, being connected to a point between the high-potential side of said load impedance and the emitter element of said feedback transistor.

2. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a pair of connections for a source of biasing potential for said other transistor and a pair of connections for an input signal, said two pairs of connections being connected in series between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load impedance and a pair of connections for a source of supply potential connected between the emitter element of said feedback transistor and said point of reference potential, the latter being connected to one of said supply-source connections, said output circuit also including a pair of output connections, one being connected to said point of reference potential and the other, which forms the third terminal of said transistor circuit, being connected to a point between the high-potential side of said load impedance and the emitter element of said feedback transistor.

3. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a pair of connections for a source of biasing potential for said other transistor and a pair of connections for an input signal, said two pairs of connections being connected between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load impedance and a pair of connections for a source of supply potential connected in series between the emitter element of said feedback transistor and said point of reference potential, the latter being connected to one of said supply-source connections, said output circuit also including a pair of output connections, one being connected to said point of reference potential and the other, which forms the third terminal of said transistor circuit, being connected to a point between the high-potential side of said load impedance and the emitter element of said feedback transistor.

4. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a pair of connections for a source of biasing potential for said other transistor and a pair of connections for an input signal, said two pairs of connections being connected in series between said point of reference potential and the base element of said other transistor, control of the state of conduction of said other transistor being effected by the resultant voltage applied between base and emitter elements of said other transister, one of said input signal connections being connected to said point of reference potential and the other forming the second terminal of said transistor circuit, said output circuit including a load impedance and a pair of connections for a source of supply potential connected in series between the emitter element of said feedback transistor and said point of reference potential, the latter being connected to one of said supply-source connections, said output circuit also including a pair of output connections, one being connected to said point of reference potential and the other, which forms the third terminal of said transistor circuit, being connected to a point between the high-potential side of said load impedance and the emitter element of said feedback transistor.

5. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a pair of connections for a source of biasing potential for said other transistor and a pair of connections for an input signal, said two pairs of connections being connected in series between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load impedance and a pair of connections for a source of supply potential connected in series between the emitter element of said feedback transistor and said point of reference potential, the latter being connected to one of said supply-source connections, said output circuit also including a blocking capacitor and a pair of output connections, one being connected to said point of reference potential and the other, which forms the third terminal of said transistor circuit, being connected to one side of said capacitor, the other side of said capacitor being connected to a point between the high-potential side of said load impedance and the emitter element of said feedback transistor.

6. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including an impedance, a pair of connections for a source of biasing potential for said other transistor and a pair of connections for an input signal, said two pairs of connections and said impedance being connected in series between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load impedance and a pair of connections for a source of supply potential connected in series between the emitter element of said feedback transistor and said point of reference potential, the latter being connected to one of said supply-source connections, said output circuit also including a blocking capacitor and a pair of output connections, one being connected to said point of reference potential and the other, which forms the third terminal of said transister circuit, being connected to one side of said capacitor, the other side of said capacitor being connected to a point between the high-potential side of said load impedance and the emitter element of said feedback transistor.

7. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit including a resistance, a pair of connections for a source of biasing potential for said other transistor and a pair of connections for an input signal, said two pairs of connections and said resistance being connected in series between said point of reference potential and the base element of said other transistor, control of the state of conduction of said other transistor being effected by the resultant voltage applied between base and emitter elements of said other transistor, one of said input signal connections being connected to said point of reference potential and the other forming the second terminal of said transistor circuit, said output circuit including a load resistance and a pair of connections for a source of supply potential connected in series between the emitter element of said feedback transistor and said point of reference potential, the latter being connected to one of said supply-source connections, said output circuit also including a blocking capacitor and a pair of output connections, one being connected to said point of reference potential and the other, which forms the third terminal of said transistor circuit, being connected to one side of said capacitor, the other side of said capacitor being connected to a point between the high-potential side of said load resistance and the emitter element of said feedback transistor.

8. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit comprising a network which includes impedance, a pair of connections for a source of biasing potential and a pair of connections for an input signal, said network being connected between the base and emitter elements of said other transistor, control of the state of conduction of said other transistor being effected by the resultant voltage applied between the base and emitter elements, one of said input signal connections being connecter to said point of reference potential and the other forming the second terminal of said transistor circuit, said output circuit including a load impedance and a pair of connections for a source of supply potential connected between the emitter element of said feedback transistor and said point of reference potential, the latter being connected to one of said supply-source connections, said output circuit also including a pair of output connections, one being connected to said point of reference potential and the other, which forms the third terminal of said transistor circuit, being connected to a point between the high-potential side of said load impedance and the emitter element of said feedback transistor.

9. A three-terminal transistor circuit having thyratron-like characteristics comprising, in combination, transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit, said hook common-emitter circuit having an input circuit and an output circuit, said input circuit comprising a network which includes impedance, a pair of connections for a source of biasing potential and a pair of connections for an input signal, said network being connected between the base and emitter elements of said other transistor, control of the state of conduction of said other transistor being effected by the resultant voltage applied between the base and emitter elements, one of said input signal connections being connected to said point of reference potential and the other forming the second terminal of said transistor circuit, said output circuit including a load impedance and a pair of connections for a source of supply potential connected between the emitter element of said feedback transistor and said point of reference potential, the latter being connected to one of said supply-source connections, said output circuit also including a blocking capacitor and a pair of output connections, one being connected to said point of reference potential and the other, which forms the third terminal of said transistor circuit, being connected to one side of said capacitor, the other side of said capacitor being connected to a point between the high-potential side of said load impedance and the emitter element of said feedback transistor.

10. A three-terminal transistor circuit having thyratron-like characteristics comprising, in combination: transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit; means providing suitable supply potentials to said transistor means; means providing suitable biasing potentials to said transistor means; a pair of connections for an input signal, said input-signal connections and said biasing-potential means being connected in circuit between the base and emitter elements of said other transistor to provide a resultant voltage to these elements, the state of conduction of said other transistor being controlled by this resultant voltage, one of said input signal connections being connected to said point of reference potential and the other forming the second terminal of said transistor circuit; and a pair of output connections, one being connected to said point of reference potential and the other, which forms the third terminal of said transistor circuit, being connected to a point of variable potential between the emitter element of said feedback transistor and the high-potential side of said supply-potential means.

11. A three-terminal transistor circuit having thyratron-like characteristics comprising, in combination: transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit; means providing suitable supply potentials to said transistor means; means providing suitable biasing potentials to said transistor means; a pair of connections for an input signal, said input-signal connections and said biasing-potential means being connected in circuit between the base and emitter elements of said other transistor to provide a resultant voltage to these elements, the state of conduction of said other transistor being controlled by this resultant voltage, one of said input signal connections being connected to said point of reference potential and the other forming the second terminal of said transistor circuit; and a blocking capacitor and a pair of output connections, one of said output connections being connected to said point of reference potential and the other, which forms the third terminal of said transistor circuit, being connected to one side of said capacitor, the other side of said capacitor being connected to a point of variable potential between the emitter element of said feedback transistor and the high-potential side of said supply-potential means.

12. A device as set forth in claim 11, wherein said means for providing supply potentials for said transistor means comprises a capacitor connected between the emitter of said other transistor and said reference potential point and means for charging said capacitor, whereby when said transistor means is in a state of low conductivity, said capacitor is permitted to charge and when said transistor means is in a state of high conductivity, said capacitor discharges through said transistor means.

References Cited in the file of this patent

UNITED STATES PATENTS

| | | |
|---|---|---|
| 2,655,609 | Shockley | Oct. 13, 1953 |
| 2,655,610 | Ebers | Oct. 13, 1953 |
| 2,797,327 | Kidd | June 25, 1957 |
| 2,864,062 | Schaffner | Dec. 9, 1958 |
| 2,864,985 | Beck | Dec. 16, 1958 |
| 2,890,353 | Overbeek et al. | June 9, 1959 |
| 2,896,094 | Moody | July 21, 1959 |
| 2,901,639 | Woll | Aug. 25, 1959 |
| 2,904,758 | Miranda et al. | Sept. 15, 1959 |
| 2,907,896 | Yii | Oct. 6, 1959 |
| 2,945,134 | Moody et al. | July 12, 1960 |

FOREIGN PATENTS

| | | |
|---|---|---|
| 200,400 | Australia | Apr. 28, 1955 |

OTHER REFERENCES

"The Transistor Regenerative Amplifier as a Computer Element," by Chaplin, The Proceedings of the Institute of Elec. Eng., vol. 101, No. 83 (Part II), October 1954, page 298.

"Pulse and Digital Circuits," by Millman and Taub, published by McGraw-Hill, N.Y., 1956, pages 204 to 208.